US008471582B2

(12) United States Patent
Toms (10) Patent No.: US 8,471,582 B2
(45) Date of Patent: Jun. 25, 2013

(54) CIRCUIT FOR DETECTING TIER-TO-TIER COUPLINGS IN STACKED INTEGRATED CIRCUIT DEVICES

(75) Inventor: Thomas R. Toms, Dripping Springs, TX (US)

(73) Assignee: QUALCOMM Incorporated, San Diego, CA (US)

( * ) Notice: Subject to any disclaimer, the term of this patent is extended or adjusted under 35 U.S.C. 154(b) by 674 days.

(21) Appl. No.: 12/360,244

(22) Filed: Jan. 27, 2009

(65) Prior Publication Data

US 2010/0188114 A1 Jul. 29, 2010

(51) Int. Cl.
*G01R 31/20* (2006.01)

(52) U.S. Cl.
USPC .... 324/757.04; 324/527; 324/523; 324/750.3

(58) Field of Classification Search
USPC ............................................ 324/763, 757.04
See application file for complete search history.

(56) References Cited

U.S. PATENT DOCUMENTS

| 4,703,483 A | 10/1987 | Enomoto | |
|---|---|---|---|
| 6,104,198 A * | 8/2000 | Brooks | 324/538 |
| 6,469,557 B2 * | 10/2002 | Hirabayashi | 327/263 |
| 6,681,355 B1 * | 1/2004 | Gion et al. | 714/727 |
| 6,788,070 B2 * | 9/2004 | Ishigaki | 324/508 |
| 6,815,986 B2 * | 11/2004 | Roy et al. | 327/149 |
| 6,992,489 B2 * | 1/2006 | Bhattacharya et al. | 324/522 |
| 7,208,345 B2 * | 4/2007 | Meyer et al. | 438/109 |
| 2002/0020904 A1 | 2/2002 | Hikita | |
| 2002/0121679 A1 * | 9/2002 | Bazarjani et al. | 257/666 |
| 2006/0001176 A1 | 1/2006 | Fukaishi | |
| 2006/0141827 A1 * | 6/2006 | Auray et al. | 439/92 |
| 2006/0232292 A1 * | 10/2006 | Shimizume et al. | 324/765 |
| 2007/0252612 A1 * | 11/2007 | Sylvester | 324/765 |
| 2008/0048706 A1 * | 2/2008 | Shimizume et al. | 324/765 |
| 2008/0216031 A1 | 9/2008 | Dalton | |
| 2009/0102503 A1 * | 4/2009 | Saito | 324/765 |
| 2011/0309519 A1 * | 12/2011 | Kim | 257/774 |

FOREIGN PATENT DOCUMENTS

| CN | 101154654 A | 4/2008 |
|---|---|---|
| JP | 57199869 U | 12/1982 |
| JP | 61035546 A | 2/1986 |
| JP | 8101255 | 4/1996 |
| TW | 200615971 | 5/2006 |

OTHER PUBLICATIONS

International Search Report—PCT/ US2010/022279, International Search Authority—European Patent Office Jul. 23, 2010.
Written Opinion—PCT/ US2010/022279, International Search Authority—European Patent Office Jul. 23, 2010.

\* cited by examiner

*Primary Examiner* — Richard Isla Rodas
(74) *Attorney, Agent, or Firm* — Michelle Gallardo (57) ABSTRACT

A first semiconductor tier has a first tier-to-tier connector for detecting a tier-to-tier coupling in a stacked integrated circuit (IC) device. A second semiconductor tier has a second tier-to-tier connector configured to electrically couple to the first tier-to-tier connector. A tier-to-tier detection circuit electrically couples to the second tier-to-tier connector. The tier-to-tier detection circuit generates an output signal indicative of an electrical coupling between the first semiconductor tier and the second semiconductor tier.

21 Claims, 9 Drawing Sheets

CIRCUIT FOR DETECTING TIER-TO-TIER COUPLINGS IN STACKED INTEGRATED CIRCUIT DEVICES

FIELD OF DISCLOSURE

The present disclosure generally relates to three-dimensional semiconductor technology. More specifically, the present disclosure relates to a circuit for detecting tier-to-tier couplings in stacked integrated circuit (IC) devices.

BACKGROUND

A feature of semiconductor stacking is the construction of a complete circuit on two or more stacked tiers. Such stacked IC devices include separate dies stacked together to create the complete circuit where at least one die is part of and corresponds to a tier. In order for such stacked IC devices to function properly, it is desirable to detect that the tiers are electrically coupled.

Conventionally, verification of the electrical coupling between tiers in a three-dimensional stack has been done by testing the stacked IC devices using external software-based production tests, such as applying input signals to the circuitry and observing the resultant output signals. It is desirable, however, to test the coupling between tiers without using external test signals.

Thus, it is desirable to develop a technique for identification of coupling between semiconductor tiers where the technique is independent of software-based input sequencing and added input test signals.

BRIEF SUMMARY

Various embodiments of the invention include a stacked IC device with a detection circuit that generates an output signal to indicate whether individual semiconductor tiers of the stacked IC device are electrically coupled together.

The present disclosure includes a stacked IC device for detecting a tier-to-tier coupling. In one embodiment, a first semiconductor tier has a first tier-to-tier connector. A second semiconductor tier has a second tier-to-tier connector configured to electrically couple to the first tier-to-tier connector. A tier-to-tier detection circuit electrically couples to the second tier-to-tier connector. The tier-to-tier detection circuit generates an output signal indicative of an electrical coupling between the first semiconductor tier and the second semiconductor tier.

In another embodiment, a stacked IC device has a circuit that detects bonded semiconductor tiers. The circuit includes a means for detecting whether a tier-to-tier coupling exists between a first semiconductor tier and a second semiconductor tier. The detecting means is disposed within at least one of the semiconductor tiers.

In still another embodiment, the present disclosure includes a process of operating a detection circuit that detects tier-to-tier couplings in stacked IC devices. The process begins with powering on a first semiconductor tier and a second semiconductor tier. It is then determined whether the first tier semiconductor tier is electrically coupled to the second semiconductor tier. The process includes generating an output signal indicating an unbonded state when the tiers are not electrically coupled. Alternatively, the output signal is generated indicating a bonded state when the tiers are electrically coupled.

In yet another embodiment, the present disclosure includes a method of producing a stacked IC device having a circuit that detects a tier-to-tier coupling. The method begins with fabricating a first semiconductor tier with a first tier-to-tier connector. A second semiconductor tier is fabricated with a second tier-to-tier connector that is configured to couple to the first tier-to-tier connector. Further, a detection circuit is fabricated, within at least one of the tiers, that generates an output signal indicating whether the first semiconductor tier electrically couples with the second semiconductor tier.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
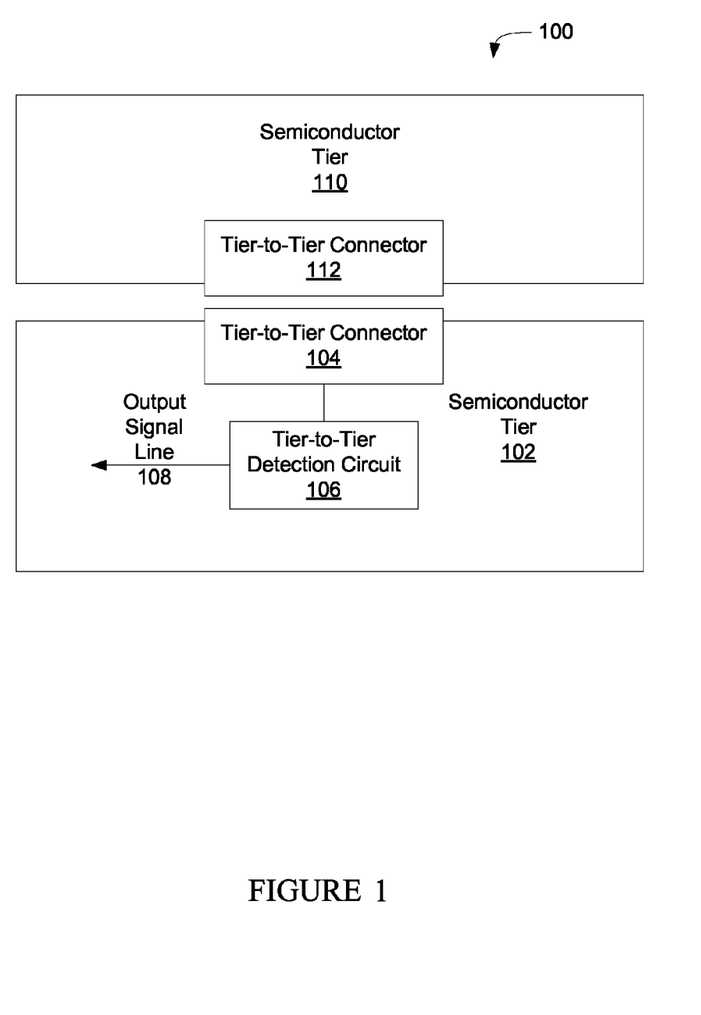
FIG. 1 is a diagram of an exemplary stacked IC device with detection circuitry.

FIG. 1 is a diagram of an exemplary stacked IC device 100 with tier-to-tier detection circuitry. The stacked IC device 100 includes a first semiconductor tier 102 with a tier-to-tier connector 104 and a second semiconductor tier 110 with a tier-to-tier connector 112. To detect whether the semiconductor tiers 102, 110 are bonded, the semiconductor tier 102 has a tier-to-tier detection circuit 106. Although not shown herein for simplicity, in some embodiments the second semiconductor tier 110 has a tier-to-tier detection circuit, either in addition to or instead of the tier-to-tier detection circuit 106.

The tier-to-tier detection circuit 106 is electrically coupled to the tier-to-tier connector 104 to detect a tier-to-tier coupling between the semiconductor tiers 102, 110. A signal on the output signal line 108 indicates whether the tier-to-tier coupling is present. In one embodiment, the signal on the output signal line 108 is routed globally across the semiconductor tier 102 to control reconfiguration of the semiconductor tier 102 based upon the bonding state.

In this particular example, the tier-to-tier detection circuit 106 is configured to have higher resistivity than the tier-to-tier connectors 104, 112. Accordingly, the tier-to-tier detection circuit 106 draws relatively little electrical current. The output signal line 108 is coupled to a supply node (not shown) via a high resistance path (not shown) to create an output signal indicative of an unbonded state when there is no coupling between the semiconductor tiers 102, 110. By contrast, when the tier-to-tier coupling exists, current from the second semiconductor tier 110 overdrives the signal from the supply node so the signal on the output signal line 108 indicates a properly bonded state. In other words, when a tier-to-tier coupling is detected by the tier-to-tier detection circuit 106, the tier-to-tier detection circuit 106 flips the voltage of the signal on the output signal line 108, relative to the unbonded state, to indicate a bonded state.

In one embodiment, the output signal indicates an unbonded state when the semiconductor tiers 102, 110 are not bonded with a logical "0." It is also possible for the output signal to have a value of logical "1" to indicate the unbonded state.

Figure 2:
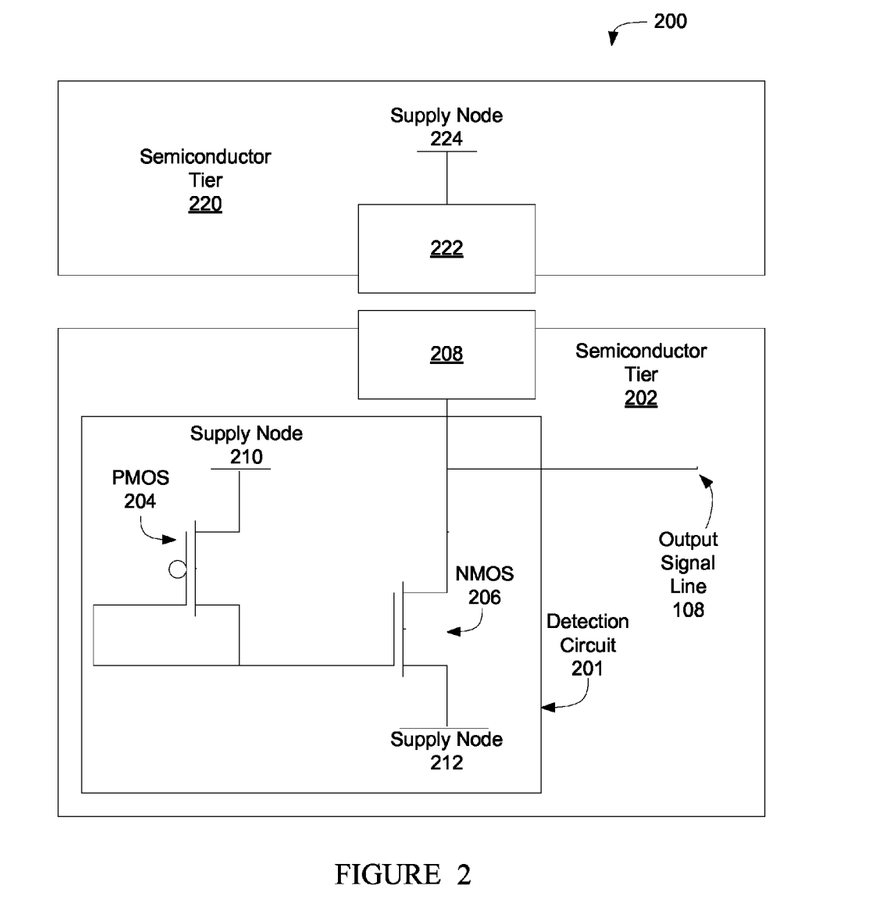
FIG. 2 is a schematic of a stacked IC device having a detection circuit that incorporates active circuit elements.

FIG. 2 depicts a stacked IC device 200 with a tier-to-tier detection circuit 201 using active circuit elements. In this particular example, the active circuit elements include field-effect transistors such as negative channel metal-oxide-semiconductor ("NMOS") transistors and positive channel metal-oxide-semiconductor ("PMOS") transistors.

In one embodiment, a supply node 212 is at a grounded level and supply nodes 210, 224 are at another voltage level. In this example, the voltages of the supply nodes 210, 224 are at the same potential as each other. When the supply nodes 210, 224 of the semiconductor tiers 202, 220 turn on, the tier-to-tier detection circuit 201 turns on. The voltage from the supply node 210 ramps up causing the PMOS transistor 204, which is in a diode configuration, to turn on. Alternatively, an external signal (not shown) can power on the PMOS transistor 204. For example, when the external signal applies a voltage that exceeds the threshold voltage of the NMOS transistor 206 at its gate node, the NMOS transistor 206 powers on. The NMOS transistor 206 is configured as a weak device, so it does not draw large amount of current. The PMOS transistor 204 continually powers on the NMOS transistor 206, because the PMOS transistor 204 is in a diode configuration. As a result of the NMOS transistor being on, the output signal is discharged to ground via the electrical current path to supply node 212. Any capacitive charge stored on the output signal line 108 is discharged at this time.

When the semiconductor tiers 202, 220 bond (via the tier-to-tier connectors 208, 222), there is a strong supply of power from the semiconductor tier 220 to the semiconductor tier 202. In some examples, the NMOS transistor 206 is much more resistive than the tier-to-tier connectors 208, 222 (for example 100 times more resistive) so the NMOS transistor has a negligible effect on the output signal. Consequently, the output signal on the output signal line 108 is driven to a logical "1" when the tier-to-tier connection occurs.

In either case, the output signal can be routed globally across the semiconductor tier 202 so the semiconductor tier 202 can function according to whether the semiconductor tiers 202, 220 are bonded or not. In a further aspect, once the semiconductor tiers 202, 220 are bonded, the output signal is globally routed across both semiconductor tiers 202, 220.

In the embodiment described above, the supply nodes 210, 224 are configured to power on at the same time. In another embodiment, the supply nodes 210, 224 are configured as different domains that power on at different times, for example, the supply node 224 can be turned off (i.e., it has its own domain) while the supply node 210 remains powered on. When this occurs, the powering off of the supply node 224 will create the appearance of an unbonded state.

In still another embodiment, the voltages of the supply nodes 212, 224 are reversed. That is, the voltage of the supply node 224 can be configured to be in or over ground (e.g., VSS) while the voltage of the supply node 212 is tied to power (e.g., VDD). In this example, the tier-to-tier detection circuit 201 ramps the output signal voltage down, instead of up, when the semiconductor tiers 202, 220 bond. The reason for this is the output signal goes to a high voltage when the NMOS transistor 206 is on and provides an electrical current path to the positive voltage at the supply node 212 while the semiconductor tiers 202, 220 remain unbonded. In other words, the unbonded state results in a logical "1" on the output signal line 108. In this embodiment, when the semiconductor tiers 202, 220 bond, the signal on the output signal line 108 is grounded (i.e., logical "0"). In this embodiment, the active circuit elements are reconfigured so the PMOS transistor 204 is an NMOS transistor and the NMOS transistor 206 is a PMOS transistor.

In some embodiments, the stacked IC device 200 and the above-described elements may be varied and are not limited to the functions, structures, configurations, implementations, or aspects provided.

Figure 3A:
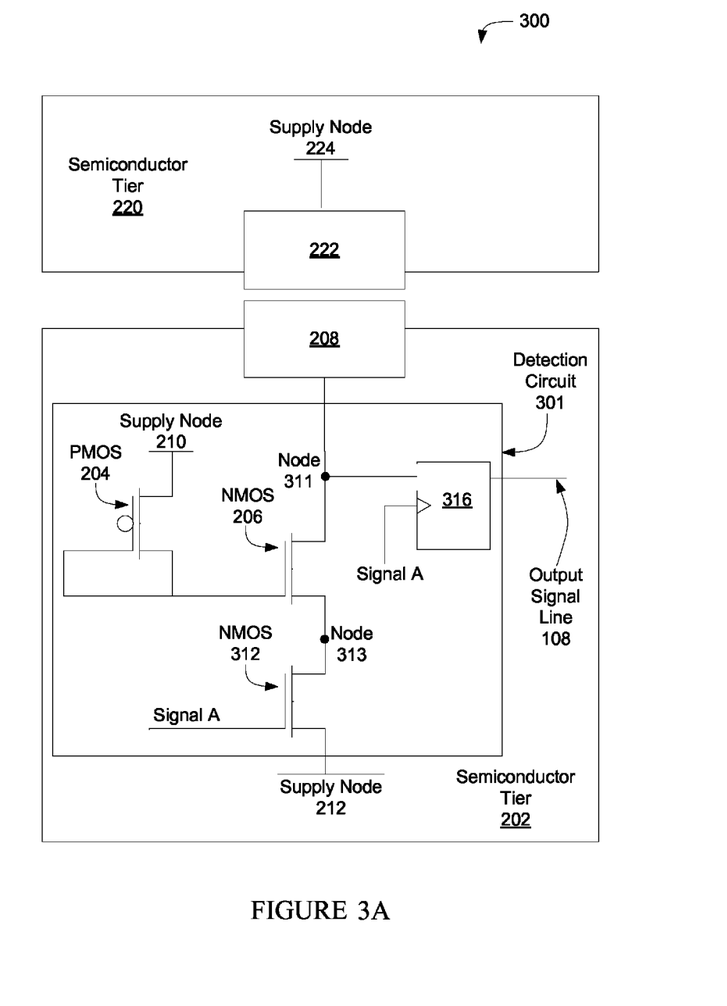
FIG. 3A is a schematic of a stacked IC device having an exemplary detection circuit including a sampling circuit.

FIG. 3A is a schematic of an alternate embodiment in which a stacked IC device 300 has an exemplary detection circuit including a sampling circuit. Some of the active circuit elements of FIG. 3A are the same elements as those elements shown in FIG. 2 and will not be described in detail. The supply nodes 210, 212, 224 are configured to operate in a similar manner as that described with respect to FIG. 2.

In the embodiment of FIG. 3A, the PMOS transistor 204 turns on the NMOS transistor 206. However, in this embodiment, there is not always a current path from the supply node 224 (via the tier-to-tier connectors 208, 222) to the supply node 212. Thus, when the semiconductor tiers 202, 220 are bonded, current leakage from the NMOS transistor 206 is reduced to decrease the static power dissipation of the stacked IC device 300. In other words, the tier to tier sensor can be designed to be sampled and then turned off to save energy.

To reduce the current leakage, a sampling circuit is electrically coupled to the existing circuit. The sampling circuit includes another NMOS transistor 312 interposed between the NMOS transistor 206 and the supply node 212. The sampling circuit also includes a latching device 316, such as a latch or flip-flop. In another embodiment, the latching device 316 includes a non-volatile device that holds a sampled output signal independently of power. The storage element 316 is a memory element that is able to capture and store the an input in response to a second signal, such as a clock or write signal.

In operation, a gate node of the NMOS transistor 312 is electrically coupled to an external control signal, signal A, that periodically powers on the NMOS transistor 308 for a pre-determined amount of time. In one embodiment, the external control signal, signal A, also controls the latching device 316 by coupling to a clock input of the latching device 316 so the latching device 316 is synchronized with the power-on sequence of the NMOS transistor 312.

When the NMOS transistor 312 is powered on, the electrical current path through the NMOS transistor 206 allows the output signal to discharge to ground when the semiconductor tiers 202, 220 are not bonded. When the semiconductor tiers 202, 220 are bonded, the electrical current flowing from the semiconductor tier 220 charges up the node 311 and the charge sink resulting from the supply node 212 via the NMOS transistors 206, 312 will be negligible, so the signal at the node 311 is approximately VDD. Because the latching device 316 is synchronized with the NMOS transistor 312, the bonding state is captured and stored by the latching device 316 in response to signal A. However, when the NMOS transistor 312 is not powered on by signal A, there is no electrical current path at node 313. Accordingly, power is not wasted. Moreover, the latching device 316 retains the previously stored state.

More specifically, when signal A is high (e.g., logical "1"), there will be an electrical current path through the NMOS transistor 206 and the latching device 316 latches the signal at node 311. However, there is a leakage path through the NMOS transistor 206 when the semiconductor tiers 302, 320 are bonded, wasting power. When signal A, goes low (e.g., logical "0"), the NMOS transistor 308 powers off (interrupting the leakage path), and the latching device 316 latches the value present at the node 311.

Capturing and storing the change of state reduces the amount of power leaked from the active circuit elements and reduces the amount of energy used to sample the output signal. As a result, there will be less static power dissipation from the detection circuit 301.

Of course, the latching device 316 can be a storage element of any kind, such as a latch or a flip-flop. The latching device 316 can also be a non-volatile device that retains the value sampled at the node 311 independently of power.

Figure 3B:
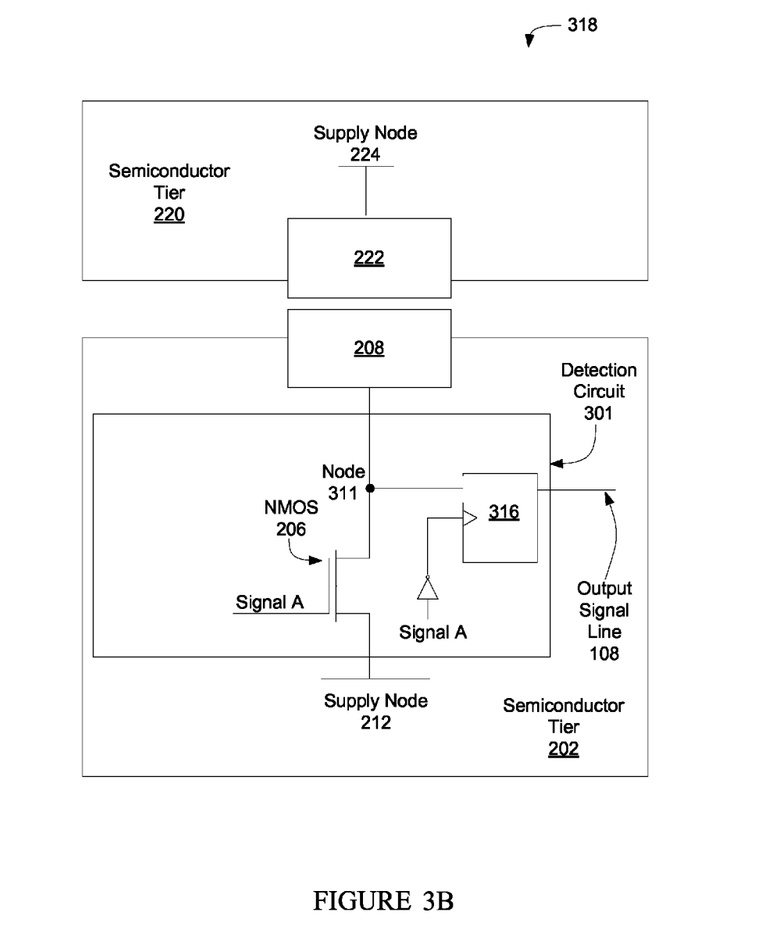
FIG. 3B is a schematic of a stacked IC device having another exemplary detection circuit including a sampling circuit.

FIG. 3B is a schematic of a stacked IC device 318 having another exemplary detection circuit including a sampling circuit. In this embodiment, the external control signal, signal A, is coupled to the gate node of the NMOS transistor 206. The data input of the latching device 316 is coupled with the drain node of the NMOS transistor 206 and the tier-to-tier connector 208. The clock input of the latching device 316 receives the external control signal, signal A, inverted. Thus, the latching device 316 updates the previously stored output value when the external control signal, signal A, is low, which drives the clock input high and powers off the NMOS transistor 206. More generally speaking, the timing causes the node 311 to hold state until the latch 316 captures the data.

Figure 3C:
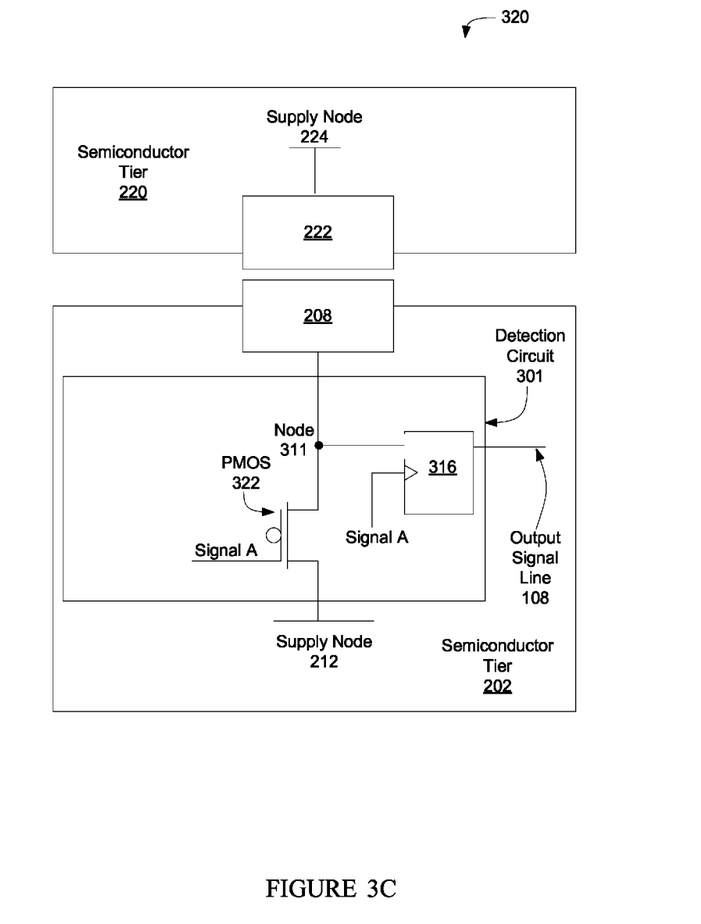
FIG. 3C is a schematic of a stacked IC device having yet another exemplary detection circuit including a sampling circuit.

FIG. 3C is a schematic of a stacked IC device 320 having yet another exemplary detection circuit including a sampling circuit. In this embodiment, the NMOS transistor 206 is replaced with a PMOS transistor 322. The external control signal, signal A, is coupled to both the gate node of the PMOS transistor 322 and the clock input of the latching device 316. The data input of the latching device 316 is coupled with the source node of the PMOS transistor 322 and the tier-to-tier connector 208.

The PMOS transistor 322 turns on when the external control signal is low. The latching device 316 updates the previously stored output value when the clock input goes high (i.e., external control signal, signal A, is a logical "1") and the PMOS transistor 204 powers off.

In another embodiment (not shown), the tier to tier sensor is a fuse (a memory element) and an inverter. Prior to bonding the two tiers together, the fuse would charge/discharge the small input capacitance of the inverter. Once bonded and powered up the tier to tier connection would create a current in the fuse that would blow the fuse so it could no longer charge/discharge the inverter's input capacitance. Thus, the bonded tier to tier connection would now discharge/charge the inverters' input capacitance. In other words, the inverter's output is the opposite value of the state of the fuse (when intact). In this embodiment, no current, no latch, and no transistors to bias a sensor are needed.

In some embodiments, the stacked IC devices 300, 318, 320 and the above-described elements may be varied and are not limited to the functions, structures, configurations, implementations, or aspects provided.

Figure 4:
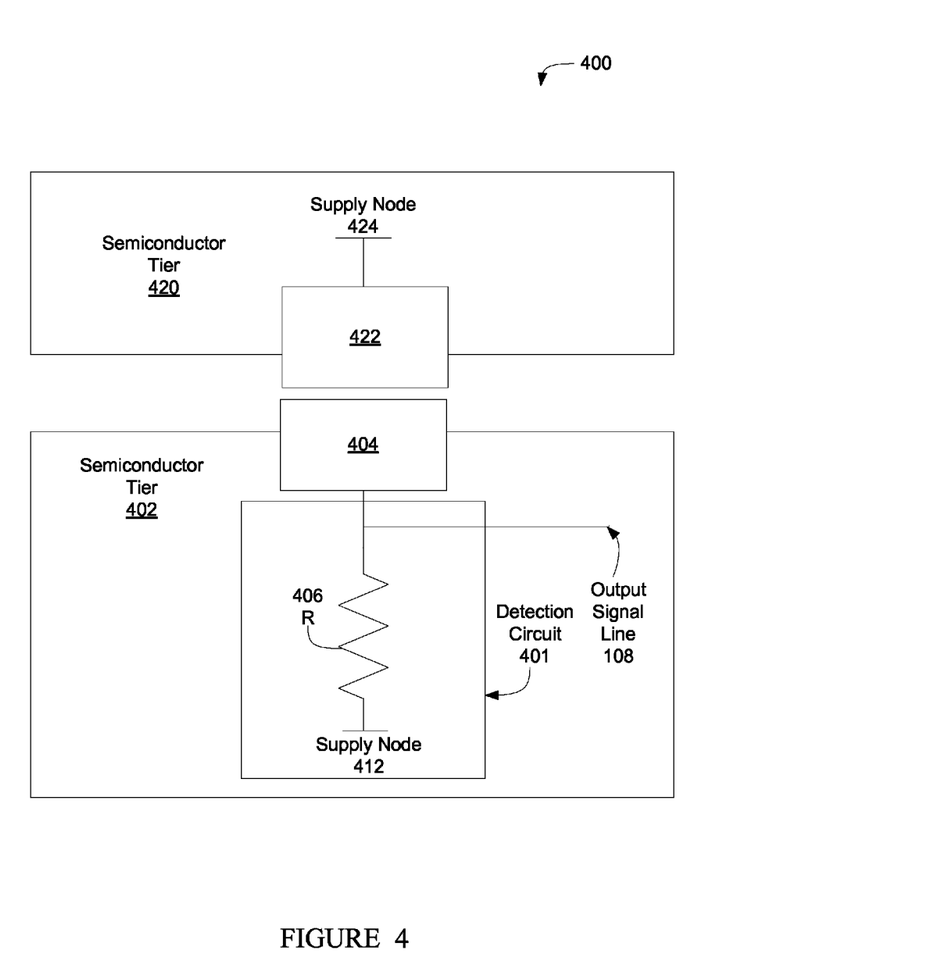
FIG. 4 is a schematic of a stacked IC device having an exemplary detection circuit using passive circuit elements.

FIG. 4 depicts a stacked IC device 400 having an exemplary detection circuit 401 using a passive circuit element, such as a resistor 406. As in FIG. 2, the bonding between the semiconductor tiers 402, 420 forms the conduction path through the tier-to-tier connectors 404, 422. The resistor 406 provides passive detection of the electrical coupling between the semiconductor tiers 402, 420.

In one embodiment, the voltage of the supply node 424 is configured to be greater than the voltage of the supply node 412. The voltage detected across the resistor 406 indicates when there is a tier-to-tier coupling. The resistor 406 can be configured to be highly resistive as opposed to the resistivity across the electrical coupling of the tiers. In other words, the resistance of the resistor 406 is much greater than the resistances of the tier-to-tier connectors 404, 422. In one example, the resistor 406 has a resistance value of one mega-ohm whereas the tier-to-tier connectors 404, 422 have a resistance of one-tenth of an ohm. As a result, when the tiers 402, 420 are coupled the voltage of the output signal 108 is substantially the same as the voltage of the supply node 424, thus indicating the coupling. Moreover, the amount of power drawn is low.

In another embodiment, the voltage of the supply node 412 is configured to be greater than the voltage of the supply node 424, resulting in an output of substantially zero when detecting the electrical coupling between the semiconductor tiers 402, 420. In some embodiments, the stacked IC device 400 and the above-described elements can be varied and are not limited to the functions, structures, configurations, implementations, or aspects described.

Figure 5:
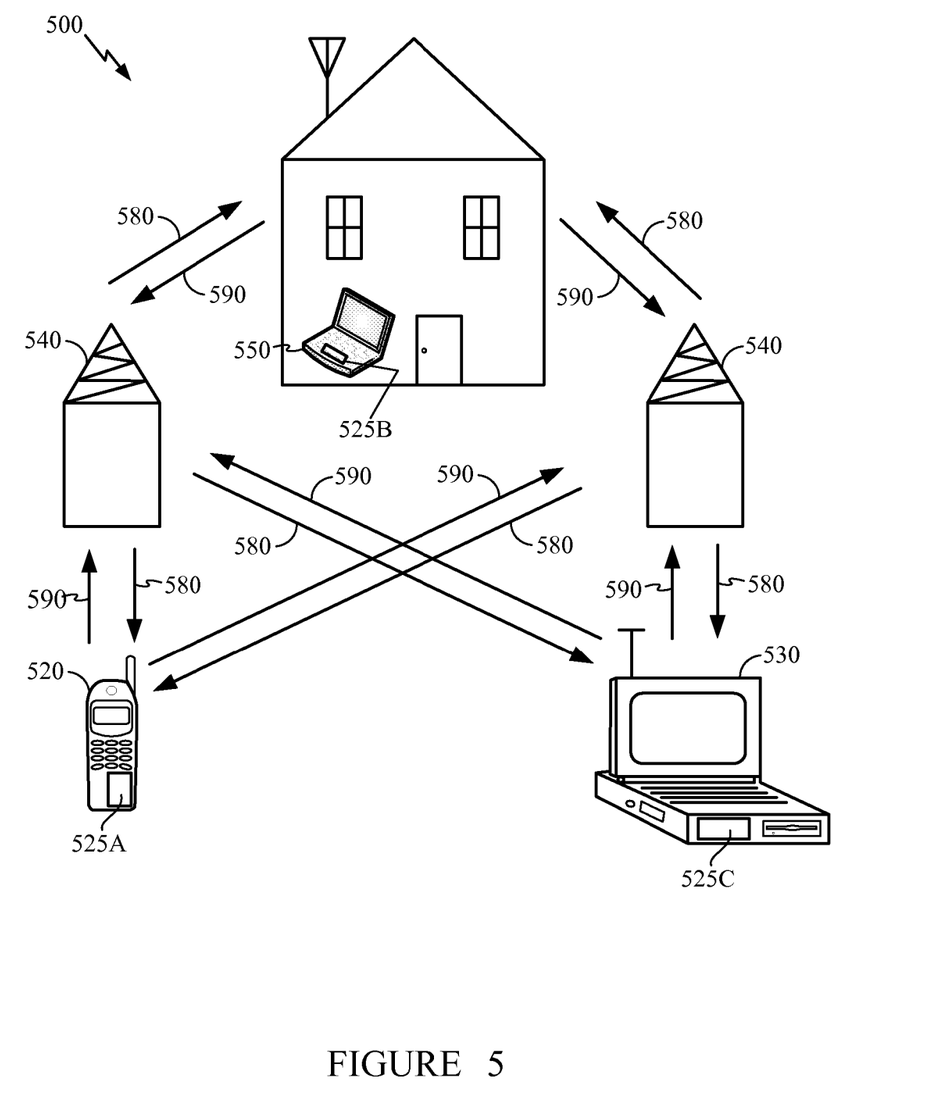
FIG. 5 is a diagram of an exemplary wireless communication system using stacked IC devices with detection circuitry.

FIG. 5 shows an exemplary wireless communication system 500 using integrated circuits having stacked IC devices including detection circuitry. For purposes of illustration, FIG. 5 shows three remote units 520, 530, and 550 and two base stations 540. It will be recognized that conventional wireless communication systems may have many more remote units and base stations. Remote units 520, 530, and 550 include stacked IC devices with detection circuitry 525A, 525B and 525C, which is an embodiment of the disclosure as discussed above. FIG. 5 shows forward link signals 580 from the base stations 540 and the remote units 520, 530, and 550 and reverse link signals 590 from the remote units 520, 530, and 550 to base stations 540.

In FIG. 5, remote unit 520 is shown as a mobile telephone, and remote units 530 and 550 are shown as portable computers. For example, the remote units may be cell phones, handheld personal communication systems (PCS) units, portable data units such as personal data assistants, or fixed location data units such as meter reading equipment. Although FIG. 5 illustrates remote units according to the teachings of the disclosure, the disclosure is not limited to these exemplary illustrated units. The disclosure may be suitably employed in any electronic device which includes stacked IC devices with detection circuitry.

Figure 6:
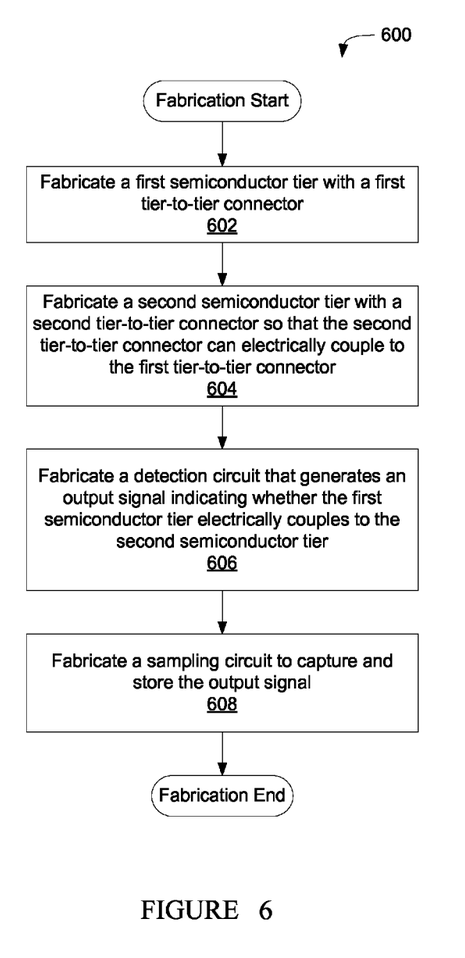
FIG. 6 is an exemplary flow diagram of a process for fabricating a detection circuit that detects tier-to-tier couplings in stacked IC devices.

FIG. 6 is an exemplary flow diagram of a method for fabricating a detection circuit that detects tier-to-tier couplings in stacked IC devices. In one embodiment, the method 600 includes fabricating a first semiconductor tier with a first tier-to-tier connector (block 602). The flow then continues with fabricating a second semiconductor tier 110 with a second tier-to-tier connector so that the first tier-to-tier connector can connect to the second tier-to-tier connector (block 604).

The flow also includes fabricating a detection circuit in the first semiconductor tier, that electrically couples to the first tier-to-tier connector so the detection circuit generates a detection signal indicating whether the first semiconductor tier connects to the second semiconductor tier (block 606). In particular embodiments, the flow may include fabricating a sampling circuit as part of the detection circuit so the detection signal is captured and stored (block 608).

In some embodiments, the method 600 and the above-described elements may be varied and are not limited to the methods, functions, configurations, implementations, or aspects provided. For example, block 608 may be eliminated.

Figure 7:
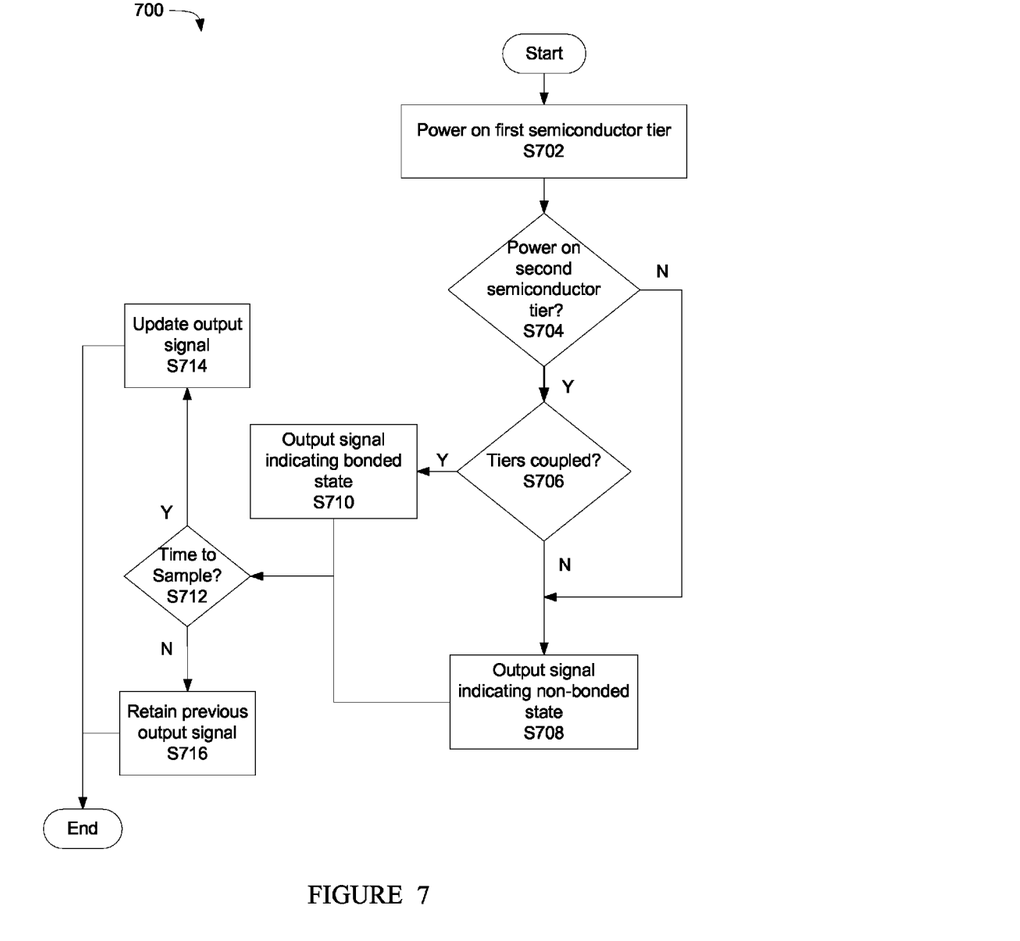
FIG. 7 is an exemplary flow diagram of a process for operating a detection circuit that detects tier-to-tier couplings in stacked IC devices.

FIG. 7 is an exemplary flow diagram of a process for operating a detection circuit that detects tier-to-tier couplings in stacked IC devices. In one embodiment, the process 700 begins with powering on a first semiconductor tier (S702). Further, at block S704 it is determined whether to power on a second semiconductor tier (in this example, the second semiconductor tier is in a separate power domain).

If the second semiconductor tier is powered on, then it is determined whether the first semiconductor tier is electrically coupled to the second semiconductor tier (S706). If the second semiconductor tier is not powered on (S704:NO), or if the tiers are not electrically coupled (S706:NO), then an output signal is generated to indicate a non-bonded state between the tiers (S708). At block S706, if it is determined that the tiers are electrically coupled, then an output signal is generated to indicate a bonded state between the tiers (S710).

It is then determined whether it is time to sample the output signal (S712). If the output signal is sampled, then the value of the output signal is updated (S714). If the output signal is not sampled, then the value of the output signal is retained (S716). In some embodiments, the process 700 and the above-described elements may be varied and are not limited to the methods, functions, configurations, implementations, or aspects provided. For example, blocks S712-S716 may be eliminated.

In other embodiments, the process 700 may be reduced to include coupling two tiers; activating a detection circuit included in one of the two tiers; and receiving an output signal conveying information about the coupling.

The present disclosure provides multiple embodiments of a circuit that detects tier-to-tier connections in stacked IC devices. In one embodiment, a bonding state is latched so to reduce power consumption.

Coupling as set forth in this document refers to any method available to transmit signals from one location to a second location either directly or indirectly. The signals are unaltered and unprocessed between coupling points. This can include electrical, optical, or other methods.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit (IC) device, comprising:
    a first semiconductor tier of the IC device having a tier-to-tier connector configured to electrically couple to a tier-to-tier connector of a second semiconductor tier; and
    a tier-to-tier detection circuit disposed within the first semiconductor tier and electrically coupled to the tier-to-tier connector of the first semiconductor tier, the tier-to-tier detection circuit comprising first and second transistors, the first and second transistors configured to be responsive to a current from the first transistor, the second transistor configured to provide an electrical path from a first supply voltage to the tier-to-tier connector of the first semiconductor tier, the tier-to-tier detection circuit configured to generate a signal indicative of an electrical coupling between the first semiconductor tier and the second semiconductor tier.

2. The IC device of claim 1, in which the tier-to-tier detection circuit further comprises a sampling circuit configured to capture and store the signal.

3. The IC device of claim 2, wherein the sampling circuit comprises:
    a third transistor configured to control an electrical current flow through the tier-to-tier detection circuit; and
    a latch configured to capture the signal when the third transistor allows current flow through the tier-to-tier detection circuit and configured to store the signal when the third transistor substantially hinders current flow through the tier-to-tier detection circuit.

4. The IC device of claim 1, wherein the tier-to-tier detection circuit comprises a resistor substantially more resistive than the tier-to-tier connector of the first semiconductor tier and the tier-to-tier connector of the second semiconductor tier.

5. The IC device of claim 1, in which the first transistor is a PMOS transistor having a source node electrically coupled to a second supply voltage.

6. The IC device of claim 1, in which the first transistor is configured to operate as a diode, in which a drain node of the first transistor is coupled to a gate node of the first transistor.

7. The IC device of claim 1, in which the second transistor is an NMOS transistor.

8. The IC device of claim 1, in which the first supply voltage is substantially ground.

9. The integrated circuit device of claim 1, integrated into a portable computer, a cell phone, a fixed location remote unit, a mobile telephone, a portable data unit, a hand-held personal communication systems unit, a personal data assistant, a meter reading equipment, and/or a fixed location data unit.

10. An integrated circuit (IC) device, comprising:
a first semiconductor tier; and
means for detecting whether a tier-to-tier electrical coupling exists between the first semiconductor tier and a second semiconductor tier, the detecting means disposed within the first semiconductor tier and electrically coupled to a tier-to-tier connector of the first semiconductor tier, the detecting means comprising a first and a second means for switching a signal, the first and second signal switching means configured to be responsive to a current from the first signal switching means, the second signal switching means configured to provide an electrical path from a first supply voltage to the tier-to-tier connector of the first semiconductor tier.

11. The IC device of claim 10, in which the detecting means comprises at least one active component.

12. The IC device of claim 10, in which the detecting means further comprises means for sampling a signal indicating whether the first semiconductor tier and the second semiconductor tier are in a bonded state.

13. The IC device of claim 12, wherein the sampling means further comprises means for alternatively sampling and retaining the signal indicating whether the first semiconductor tier and the second semiconductor tier are in a bonded state.

14. The integrated circuit device of claim 10, integrated into a portable computer, a cell phone, a fixed location remote unit, a mobile telephone, a portable data unit, a hand-held personal communication systems unit, a personal data assistant, a meter reading equipment, and/or a fixed location data unit.

15. A process of operating a detection circuit that detects tier-to-tier couplings in an integrated circuit (IC) device, comprising:
controlling first and second transistors in a first semiconductor tier of the IC device responsive to a current from the first transistor in the first semiconductor tier of the IC device, the second transistor configured to provide an electrical path from a first supply voltage to a tier-to-tier connector of the first semiconductor tier responsive to the first semiconductor tier being stacked with a second semiconductor tier; and receiving a signal from the detection circuit conveying information about an electrical coupling between the first semiconductor tier and the second semiconductor tier.

16. The process of claim 15, further comprising integrating the integrated circuit device into a portable computer, a cell phone, a fixed location remote unit, a mobile telephone, a portable data unit, a hand-held personal communication systems unit, a personal data assistant, a meter reading equipment, and/or a fixed location data unit.

17. A method of fabricating an integrated circuit (IC) device having a circuit that detects a tier-to-tier coupling, comprising:
fabricating a first semiconductor tier of the IC device with a tier-to-tier connector that is configured to couple to a tier-to-tier connector of a second semiconductor tier; and
fabricating a detection circuit within the first semiconductor tier, the detection circuit comprising first and second transistors, the first and second transistors configured to be responsive to a current from the first transistor, the second transistor being configured to provide an electrical path from a first supply voltage to the tier-to-tier connector of the first semiconductor tier and the detection circuit being configured to generate a signal indicating whether the first semiconductor tier electrically couples with the second semiconductor tier.

18. The method of claim 17, in which fabricating the detection circuit further comprises fabricating a sampling circuit that periodically stores the signal.

19. The method of claim 17, in which fabricating the detection circuit further comprises fabricating active components.

20. The method of claim 17, in which fabricating the detection circuit further comprises fabricating a passive circuit element.

21. The method of claim 17, further comprising integrating the integrated circuit device into a portable computer, a cell phone, a fixed location remote unit, a mobile telephone, a portable data unit, a hand-held personal communication systems unit, a personal data assistant, a meter reading equipment, and/or a fixed location data unit.

* * * * *